(12) United States Patent
Iizuka (10) Patent No.: US 9,025,323 B2
(45) Date of Patent: May 5, 2015

(54) KEYBOARD DEVICE, KEYBOARD HOLDING DEVICE AND INFORMATION INPUT DEVICE

(71) Applicant: Fujitsu Component Limited, Tokyo (JP)

(72) Inventor: Koji Iizuka, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 63 days.

(21) Appl. No.: 13/750,010

(22) Filed: Jan. 25, 2013

(65) Prior Publication Data

US 2013/0222993 A1    Aug. 29, 2013

(30) Foreign Application Priority Data

Feb. 24, 2012    (JP) ................................ 2012-038828

(51) Int. Cl.
| | | |
|---|---|---|
| *G06F 1/16* | (2006.01) | |
| *G06F 3/02* | (2006.01) | |
| *G06F 3/023* | (2006.01) | |

(52) U.S. Cl.
CPC ............... *G06F 1/16* (2013.01); *G06F 1/1669* (2013.01); *G06F 3/0202* (2013.01); *G06F 3/023* (2013.01)

(58) Field of Classification Search
CPC ... G06F 1/1669; G06F 3/0202; G06F 3/0219; G06F 3/0224; G06F 3/021; G06F 3/0221; G06F 1/1624; G06F 1/1662; B41J 5/105
USPC ............ 361/679.08, 679.11, 679.13, 679.17, 361/679.2; 400/472
See application file for complete search history.

(56) References Cited

U.S. PATENT DOCUMENTS

| | | | |
|---|---|---|---|
| 5,642,257 A | 6/1997 | Saito et al. | |
| 2002/0044413 A1* | 4/2002 | Chu-Chia | ..................... 361/683 |
| 2003/0165465 A1* | 9/2003 | Roberts et al. | ............... 424/93.2 |
| 2011/0235275 A1* | 9/2011 | Su et al. | ....................... 361/692 |

FOREIGN PATENT DOCUMENTS

| | | |
|---|---|---|
| JP | 8-76881 | 3/1996 |
| JP | 2002-236523 | 8/2002 |
| JP | 2009-104398 | 5/2009 |

OTHER PUBLICATIONS

Patent Abstracts of Japan, Publication No. 08-076881, Published Mar. 22, 1996.
Patent Abstracts of Japan, Publication No. 2009-104398, Published May 14, 2009.
Patent Abstracts of Japan, Publication No. 2002-236523, Published Aug. 23, 2002.

* cited by examiner

*Primary Examiner* — Lisa Lea Edmonds
*Assistant Examiner* — Christopher L Augustin
(74) *Attorney, Agent, or Firm* — Staas & Halsey LLP (57) ABSTRACT

A keyboard device includes: an elastic portion that is provided on any one of a pair of opposed end faces, abuts on an abutting portion provided on a keyboard holding device, and biases the keyboard device in a direction toward another end face from one end face on which the elastic portion is provided; a first engaging portion that is provided on the one end face, and engages with a third engaging portion provided on the keyboard holding device; and a second engaging portion that is provided on the another end face, and engages with a fourth engaging portion provided on the keyboard holding device by the bias of the elastic portion.

8 Claims, 10 Drawing Sheets

FIG. 10B ary and explanatory and are not restrictive of the invention,
KEYBOARD DEVICE, KEYBOARD HOLDING DEVICE AND INFORMATION INPUT DEVICE

CROSS-REFERENCE TO RELATED APPLICATION

This application is based upon and claims the benefit of priority of the prior Japanese Patent Application No. 2012-038828, filed on Feb. 24, 2012, the entire contents of which are incorporated herein by reference.

FIELD

A certain aspect of the embodiments discussed herein is related to a keyboard device, a keyboard holding device and an information input device.

BACKGROUND

There has been known a console drawer as an information input device that input information to a server, for example. The console drawer is a drawer-shaped information input device having a sliding mechanism, is placed in a rack along with the server, and is drawn from the rack and put in the rack. Such a console drawer is disclosed by Patent Document 1 (i.e., Japanese Laid-Open Patent Application No. 2009-104398), for example.

The console drawer includes a keyboard unit that is the keyboard device for inputting textual information, and a drawer unit that is the keyboard holding device for holding the keyboard unit. Since the key arrangement and the type of characters to be input by keys differ for each country in which the keyboard unit is used, plural types of keyboard units exist.

On the contrary, Patent document 2 (i.e., Japanese Laid-Open Patent Application No. 08-076881) and Patent Document 3 (i.e., Japanese Laid-Open Patent Application No. 2002-236523) disclose a technique concerning a keyboard unit which is exchangeable using a tool.

SUMMARY

According to an aspect of the embodiments, there is provided a keyboard device including: an elastic portion that is provided on any one of a pair of opposed end faces, abuts on an abutting portion provided on a keyboard holding device, and biases the keyboard device in a direction toward another end face from one end face on which the elastic portion is provided; a first engaging portion that is provided on the one end face, and engages with a third engaging portion provided on the keyboard holding device; and a second engaging portion that is provided on the another end face, and engages with a fourth engaging portion provided on the keyboard holding device by the bias of the elastic portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
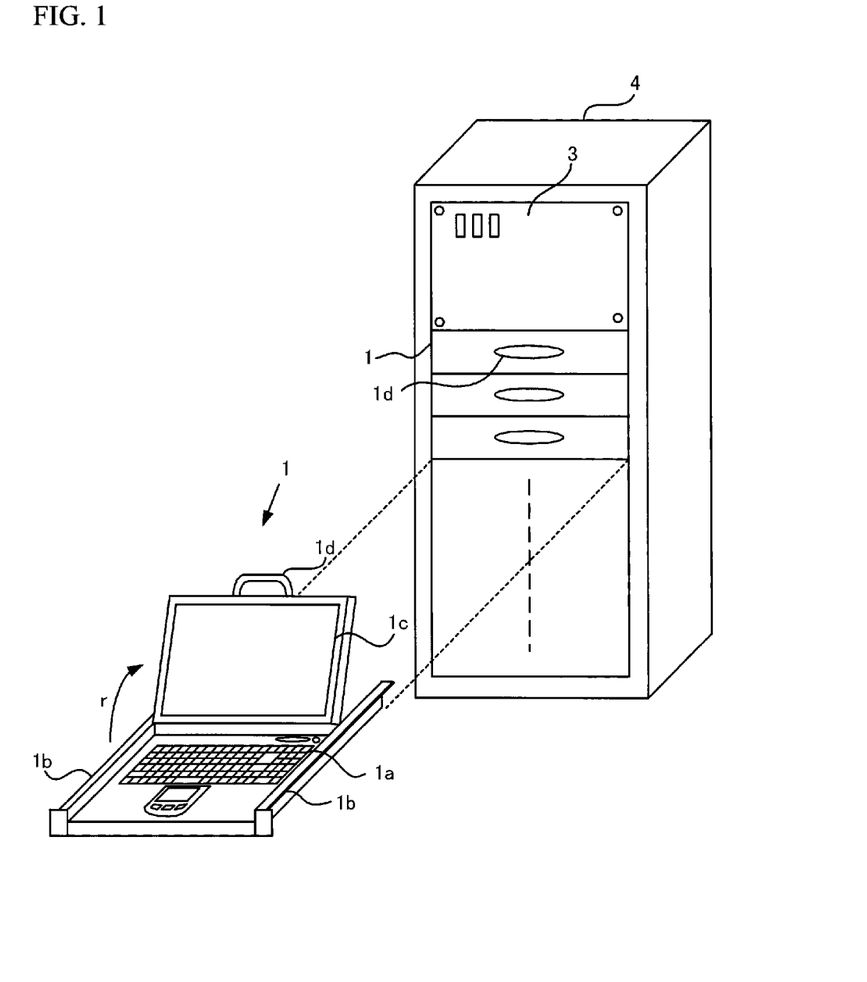
FIG. 1 is a perspective view illustrating a console drawer stored into a rack.

FIG. 1 is a perspective view illustrating a console drawer stored into a rack. A plurality of console drawers 1 and a server device 3 are stacked, and stored into a rack 4. Each of the console drawers 1 functions as an information input device for operating the server device 3.

The console drawer 1 has a shape similar to a portable personal computer, and includes a keyboard unit 1a that inputs information, and a display unit 1c that pivotally moves about the keyboard unit 1a (see code "r"). The console drawer 1 can be drawn from the rack and put in the rack by being slid with guide rail mechanisms 1b provided at both sides of the console drawer 1. When the console drawer 1 is used, the console drawer 1 is drawn from the rack 4. When the console drawer 1 is not used, the console drawer 1 is put in the rack 4.

The display unit 1c is a thin liquid crystal display, for example. When the display unit 1c is not used, the display unit 1c is closed so as to overlap on a top face of the keyboard unit 1a. A handle 1d is provided on a top end of the display unit 1c. When the display unit 1c is closed, the handle 1d is located at a front face of the console drawer 1. Therefore, a user can easily draw the console drawer 1 from the rack 4 and put the console drawer 1 in the rack 4 by gripping the handle 1d.

Figure 2:
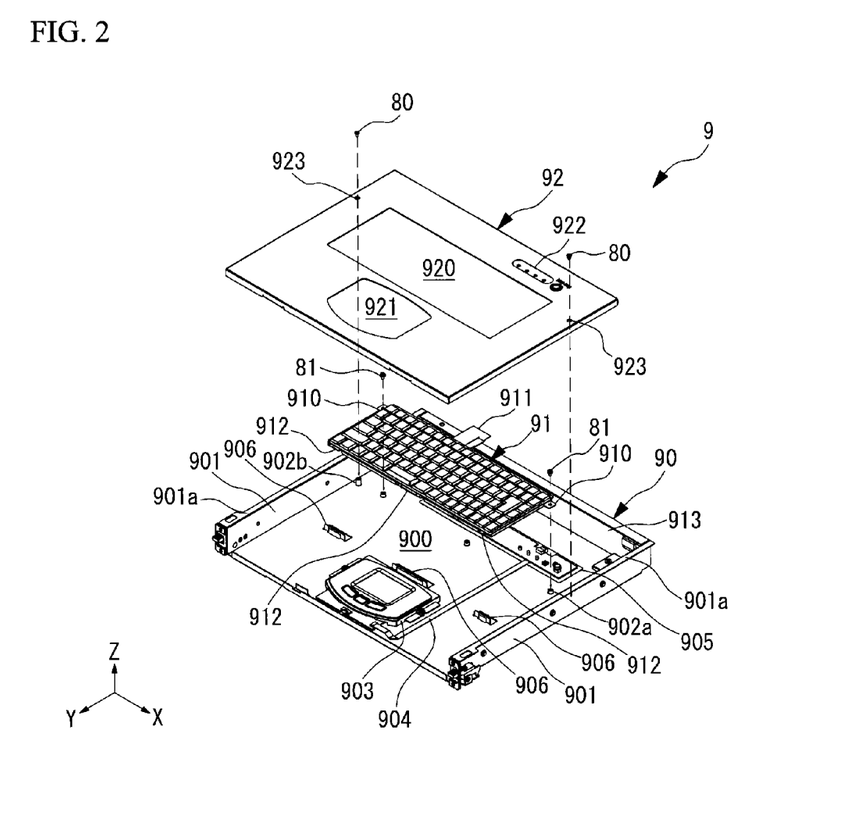
FIG. 2 is an exploded perspective view of the console drawer according to a comparative embodiment.

FIG. 2 is an exploded perspective view of the console drawer according to a comparative embodiment. A console drawer 9 includes a base member 90 that is a housing, a keyboard unit 91 that is a keyboard device, and a cover 92. In the following description, the directions of an X axis, a Y axis and a Z axis in FIG. 2 are expressed as a width direction, a depth direction and a height direction, respectively. The console drawer 9 in FIG. 2 is indicated as a state where the display unit 1c of FIG. 1 is removed. In the following drawing, the display unit is removed as is the case with FIG. 2.

The base member 90 is made of a sheet metal, for example. The base member 90 includes a rectangle-like bottom face 900, a pair of side faces 901 provided at both ends of the bottom face 900 in the width direction, and a rear face 913 provided at an end of the bottom face 900 in the depth direction. Guide rails 901a for sliding the console drawer 9 when the console drawer 9 is attached to the rack 4 are provided on the pair of side faces 901.

A pointing device 903, a wiring 904 and a substrate 905 are provided on the bottom face 900. The pointing device 903 is used for the input of position information or the like, and is electrically connected to the substrate 905 via the wiring 904. An LED (Light Emitting Diode) for status indication, a push button switch, an electric circuit and the like are provided on the substrate 905.

Three engaging parts 906 arranged in the width direction and screw fastening parts 902a and 902b are provided on the bottom face 900. Each of the engaging parts 906 has a gate shape, and the three engaging parts 906 engage with three protrusion parts 912 which are provided at an end in the side of a front face of the keyboard unit 91. That is, the protrusion parts 912 are engaged with the engaging parts 906 by being inserted into the engaging parts 906. The engaging parts 906 are formed by clipping out predetermined parts of the bottom face 900 in a predetermined shape and performing a bending process on the clipped parts.

The screw fastening parts 902a and 902b are screwed with the keyboard unit 91 and the cover 92, respectively. The keyboard unit 91 is screwed to two screw fastening parts 902a via plate-like fixed parts 910. The fixed parts 910 are provided on both sides of the keyboard unit 91 so as to extend in the width direction. A hole for inserting a screw 81 is formed on each fixed part 910.

In a state where the three protrusion parts 912 are engaged with the three engaging parts 906 of the bottom face 900, respectively, each fixed part 910 is screwed to the screw fastening part 902a of the bottom face 900, so that the keyboard unit 91 is fixed on the base member 90. The keyboard unit 91 includes an electric wiring 911 formed with a membrane, for example, and is electrically connected to the substrate 905 through the electric wiring 911.

After the keyboard unit 91 is fixed on the base member 90, the cover 92 is attached to the base member 90 by screwing the two screw fastening parts 902b with screws 80 via screw holes 923. A first opening 920 for exposing the top face of the keyboard unit 91 and a second opening 921 for exposing the top face of the pointing device 903 are formed on the cover 92. Moreover, the cover 92 has a light-penetrating part 922 for penetrating the light of the LED.

Since the screw 81 is used for attachment of the keyboard unit 91, the console drawer 9 according to the comparative embodiment requires a tool, such as a screwdriver. When the console drawer 9 is assembled, it is necessary to attach the keyboard unit 91 and the cover 92 to the base member 90 in order of the keyboard unit 91 and the cover 92. The console drawer illustrated in FIG. 3 eliminates the necessity of the order of the attachment.

Figure 3:
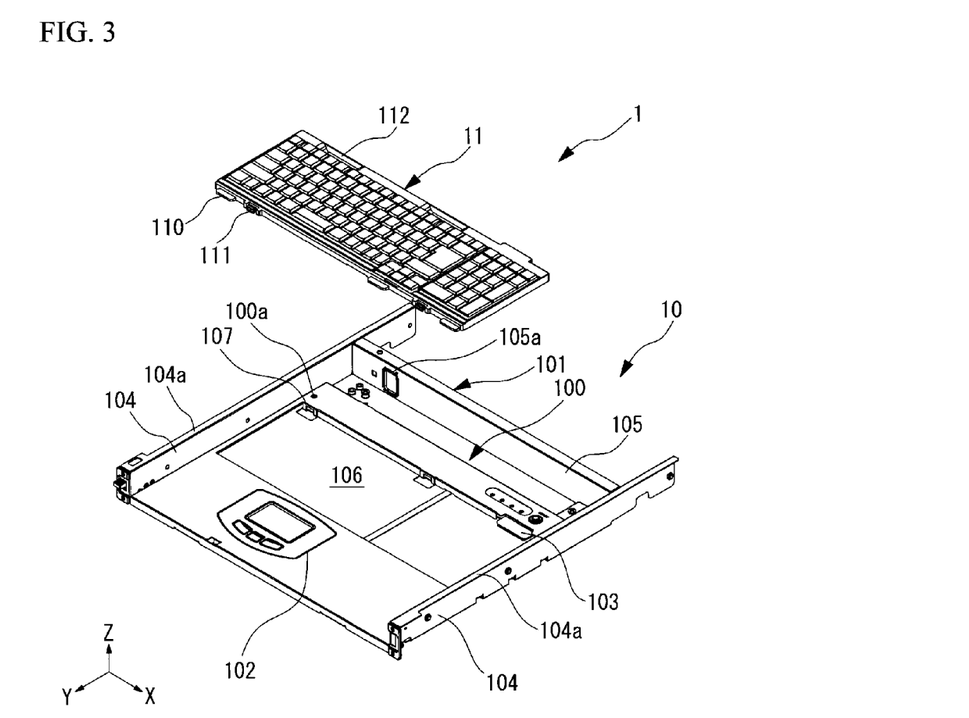
FIG. 3 is an exploded perspective view of the console drawer according to a present embodiment.
Figure 4:
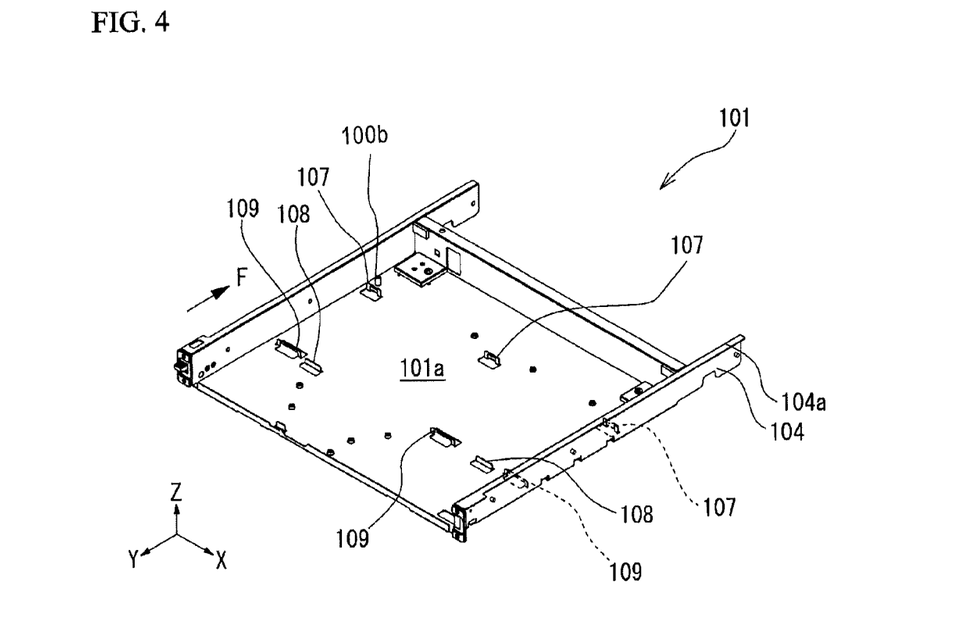
FIG. 4 is a perspective view of a base member.
Figure 5:
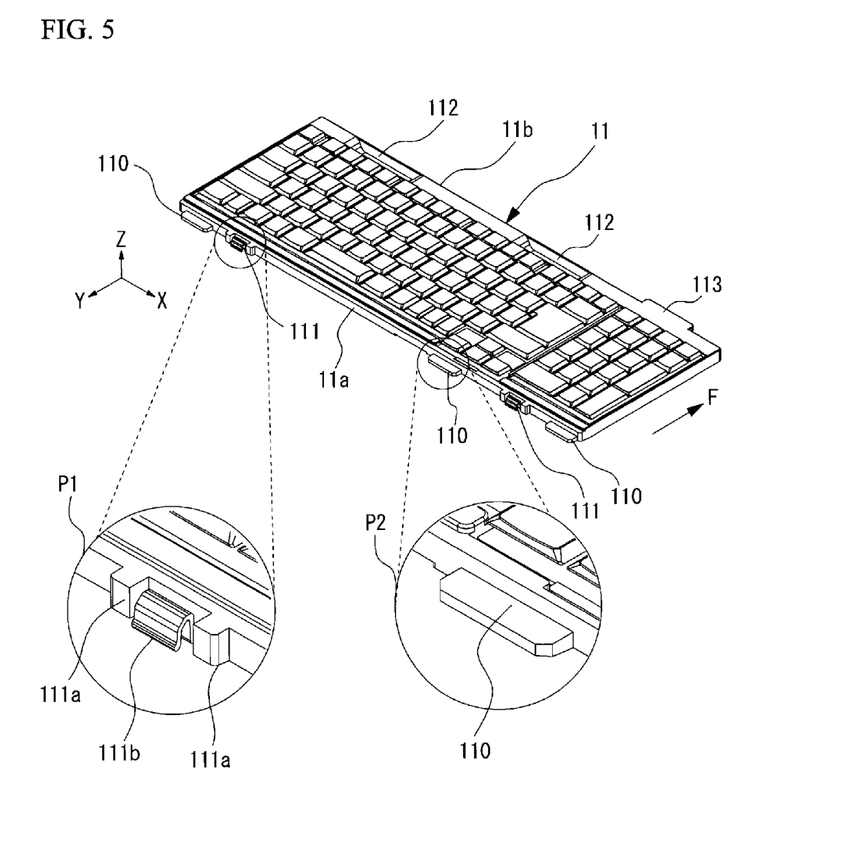
FIG. 5 is a perspective view illustrating a front side of a keyboard unit.
Figure 6:
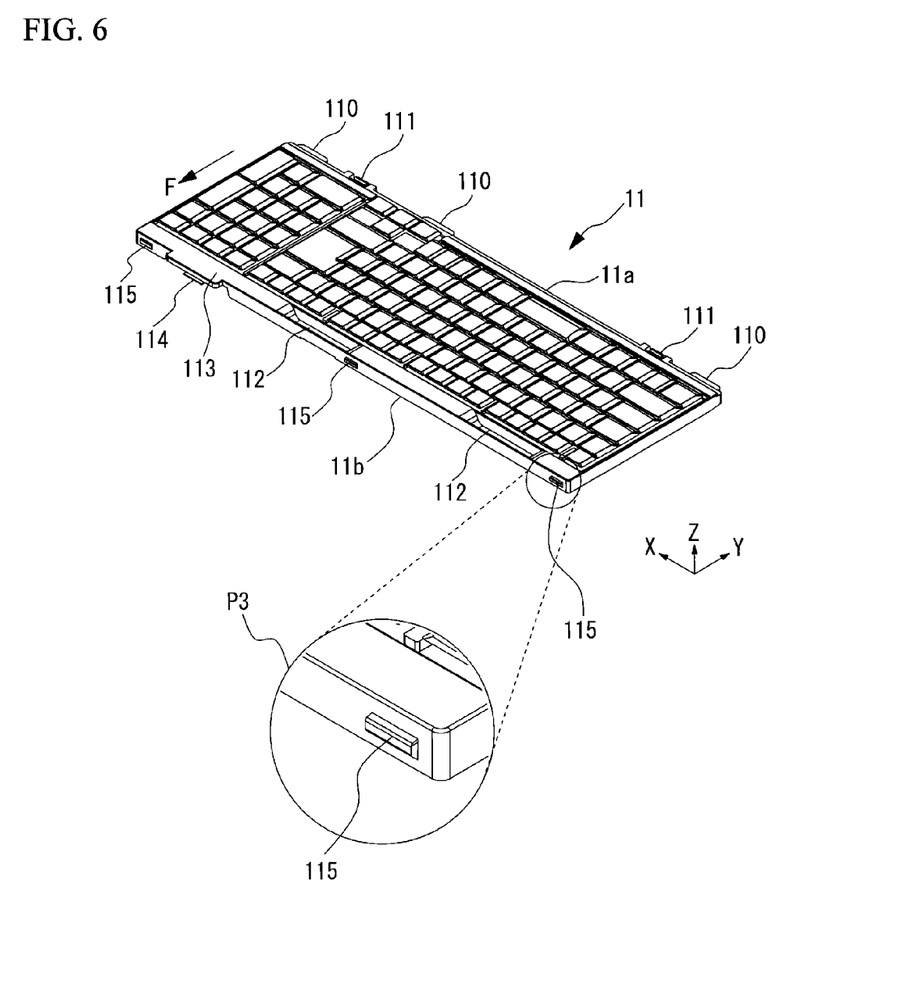
FIG. 6 is a perspective view illustrating a rear side of the keyboard unit.

FIG. 3 is an exploded perspective view of the console drawer according to a present embodiment. The console drawer 1 includes a drawer unit 10 and a keyboard unit 11. The drawer unit 10 is formed by attaching a cover 100 which is the same as the cover of the comparative embodiment to a base member 101 illustrated in FIG. 4 with a screw 100a into a screw hole 100b (FIG. 4). Also, the keyboard unit 11 is illustrated in FIGS. 5 and 6. FIG. 5 is a perspective view illustrating a front side of the keyboard unit 11, and FIG. 6 is a perspective view illustrating a rear side of the keyboard unit 11.

The keyboard unit 11 is made, for example, of ABS resin (Acrylonitrile Butadiene Styrene), and, on the whole, has the shape of a rectangle. In the keyboard unit 11, a plurality of keys are arranged. There is no limitation in the material, the whole shape and the key arrangement of the keyboard unit 11.

On the contrary, the drawer unit 10 includes a pointing device 102 and a rectangle-like holding part 106 for holding the keyboard unit 11, and functions as a keyboard holding device. Engaging members that engage with the keyboard unit 11 are provided in the holding part 106, as described later.

The base member 101 of the drawer unit 10 is made of a sheet metal as is the case with the base member 90 of the comparative embodiment described above. The base member 101 includes a bottom face 101a, a pair of side faces 104 which adjoin the bottom face 101a, and a rear face 105. Guide rails 104a for drawing the drawer unit 10 from the rack 4 and putting the drawer unit 10 in the rack 4 are provided on the pair of side faces 104, respectively. A through-hole 105a for pulling out an electric wiring to be connected to another device in the rack 4 is provided on the rear face 105.

The keyboard unit 11 includes: two elastic parts 111 and three first engaging parts 110 that are provided on one end face 11a; and three second engaging parts 115 that are provided on another end face 11b. On the contrary, the drawer unit 10 includes abutting parts 108, third engaging parts 109 and fourth engaging parts 107 that are provided on the bottom face 101a of the base member 101. The elastic parts 111 abut on the abutting parts 108, and the first engaging parts 110 and the second engaging parts 115 engage with the third engaging parts 109 and the fourth engaging parts 107, respectively, so that the keyboard unit 11 is held by the holding part 106 of the drawer unit 10.

Each of the elastic parts 111 is a plate spring 111b integrally molded with a housing of the keyboard unit 11, and each abutting part 108 is a tabular member stood in a direction perpendicular to the bottom face 101a. When the keyboard unit 11 is held in the holding part 106 of the drawer unit 10, each elastic part 111 abuts on each abutting part 108 provided in the drawer unit 10, and biases the keyboard unit 11 in a direction toward the end face 11b from the end face 11a (see code "F" of FIGS. 4 to 6).

A pair of protrusion parts 111a are provided at both sides of each elastic part 111 so as to interrupt the compression of the elastic parts 111 by abutting on the abutting parts 108 (see an enlarged part P1 of FIG. 5). Therefore, a size in the width direction of each abutting part 108 is set longer than that of each elastic part 111. According to the pair of protrusion parts 111a, each elastic part 111 is prevented from being damaged by superfluous compression. Each elastic part 111 is not limited to plate spring, and may be another elastic member, such as a spring or urethane. The elastic parts 111 may be formed separately from the keyboard unit 11. When the elastic parts 111 are integrally molded with the keyboard unit 11, the manufacture thereof is easy.

Figure 8A:
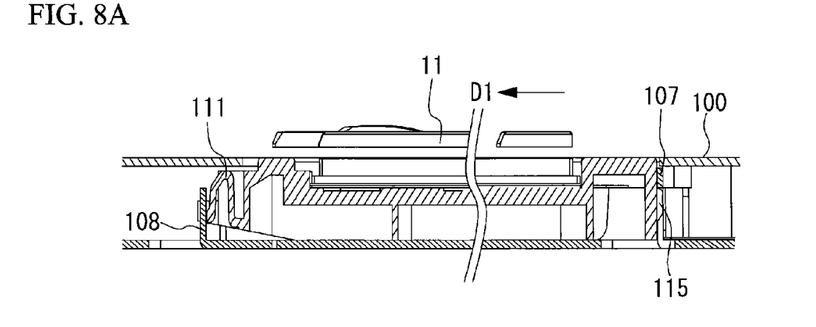
FIG. 8A is a cross sectional view taken along a line VIII-VIII in FIG. 7.
Figure 8B:
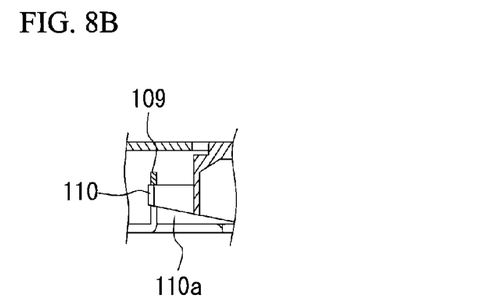
FIG. 8B is a cross sectional view concerning a first engaging unit and a third engaging unit.
Figures 9A, 9B:
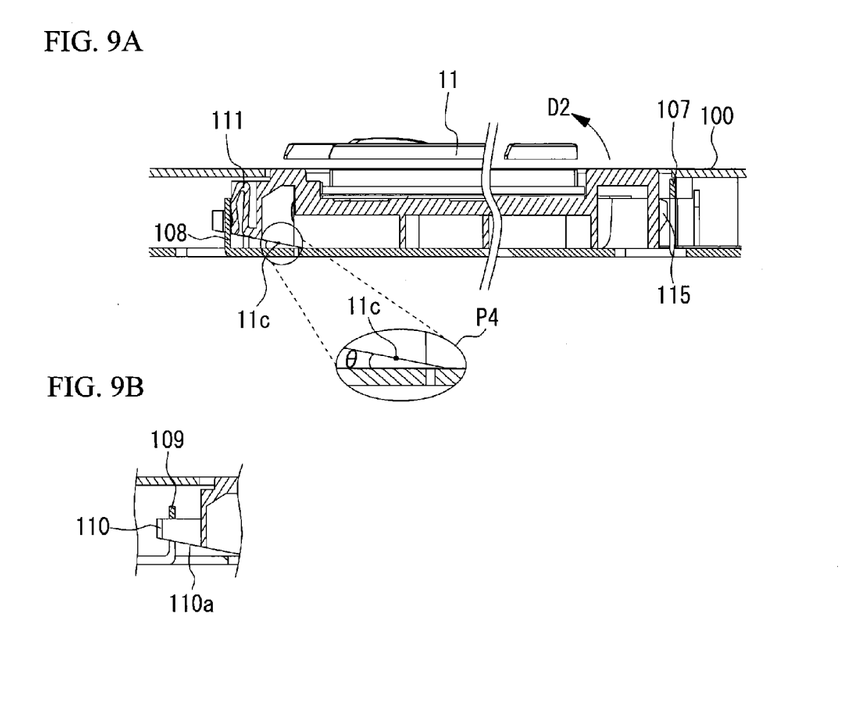
FIG. 9A is a cross sectional view illustrating a state where the keyboard unit is slid, with respect to the cross sectional view of FIG. 8A.
FIG. 9B is a cross sectional view concerning the first engaging unit and the third engaging unit.

Each first engaging part 110 is a hexagonal tabular member obtained by cutting off corners of both sides of a rectangle (see an enlarged part P2 of FIG. 5), and a taper part is formed at a bottom part of each first engaging part 110 (see a code "110a" of FIGS. 8B and 9B). Each second engaging part 115 is a protrusion member extended in the width direction (see an enlarged part P3 of FIG. 6), and taper parts are formed at top and bottom parts of each second engaging part 115. The first engaging parts 110 and the second engaging parts 115 may be integrally molded with the keyboard unit 11, or may be formed separately from the keyboard unit 11. When the first engaging parts 110 and the second engaging parts 115 are formed separately from the keyboard unit 11, the manufacture thereof is easy.

On the contrary, the third engaging parts 109 and the fourth engaging parts 107 are gate-like members. The first engaging parts 110 and the second engaging parts 115 are inserted into holes provided on the third engaging parts 109 and the fourth engaging parts 107, so that the third engaging parts 109 and the fourth engaging parts 107 are engaged with the first engaging parts 110 and the second engaging parts 115. The abutting parts 108, the third engaging parts 109 and the fourth engaging parts 107 are formed by clipping out predetermined parts of the bottom face 101a in predetermined shapes and performing a bending process on the clipped parts.

The abutting parts 108 and the third engaging parts 109 are arranged in the width direction, and arranged at different positions from the fourth engaging parts 107 in the depth direction. When the elastic parts 111 abut on the abutting parts 108, the first engaging parts 110 are configured to engage with the third engaging parts 109 of the drawer unit 10. On the contrary, the second engaging parts 115 are configured to engage with the fourth engaging parts 107 of the drawer unit 10 by the bias of the elastic parts 111.

Therefore, when the elastic parts 111 are pushed and compressed by the abutting parts 108, an engaged state of the second engaging parts 115 and the fourth engaging parts 107 is released. Thereby, the keyboard unit 11 is pushed into the holding part 106 of the drawer unit 10, or removed from the holding part 106. That is, by sliding the keyboard unit 11 in an opposite direction to the depth direction, the keyboard unit 11 can be attached or detached to the drawer unit 10.

In order to detach the keyboard unit 11 from the drawer unit 10 easily, a pair of concave portions 112 are formed in an end of the top face of the keyboard unit 11, as illustrated in FIGS. 3 and 6. Each of the concave portions 112 is a groove-like space in which taper parts are formed on both side faces of the concave portion 112 in the width direction. The user inserts fingers into the pair of concave portions 112, and can move the keyboard unit 1a so that the elastic parts 111 are compressed.

The keyboard unit 11 includes an extended part 113 that is extended from an end of the rear face. An electric wiring 114 similar to the electric wiring 911 of the keyboard unit 91 according to the comparative embodiment is provided on the end face 11b under the extended part 113. The electric wiring 114 is connected to a connector 103 (see FIG. 3) provided in the corner of the holding part 106 of the drawer unit 10. The connection to the connector 103 is performed in advance of the attachment of the keyboard unit 11 to the drawer unit 10.

Figure 7:
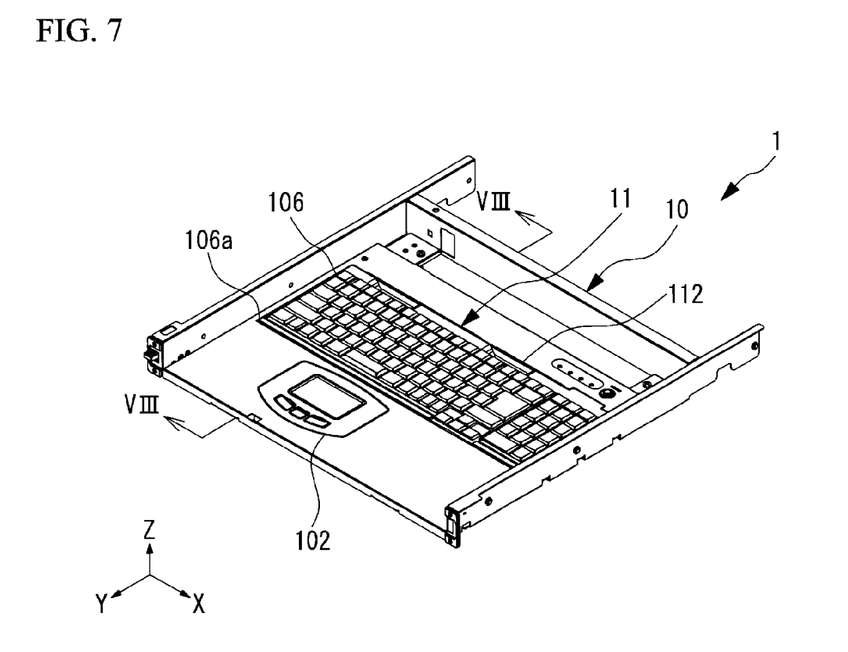
FIG. 7 is a perspective view of the console drawer according to the present embodiment.

FIG. 7 is a perspective view illustrating a state where the keyboard unit 11 is held in the holding part 106 of the drawer unit 10, i.e., a perspective view of the console drawer according to the present embodiment. The keyboard unit 11 includes a gap 106a provided between an end of the pointing device 102 and the drawer unit 10. When the keyboard unit 11 is detached from the drawer unit 10, the keyboard unit 11 is slid in a direction reducing the gap 106a so that the elastic parts 111 are compressed.

Figure 10A:
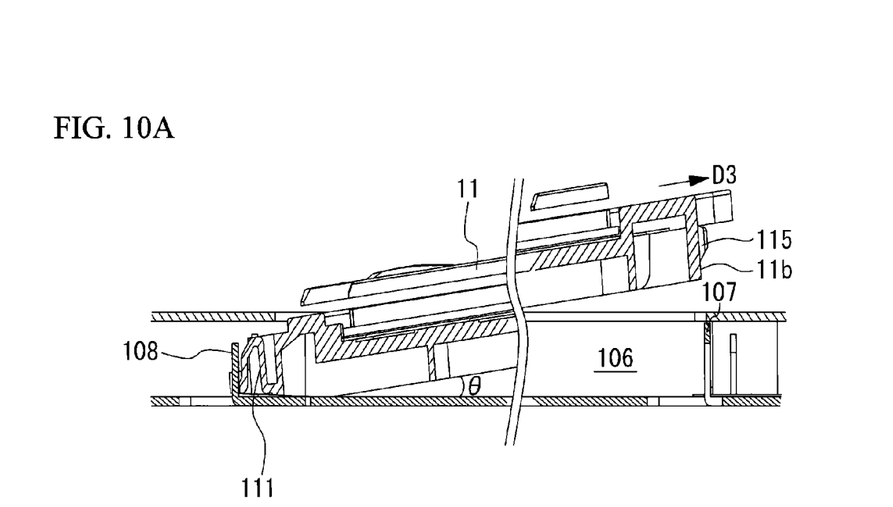
FIG. 10A is a cross sectional view illustrating a state where the keyboard unit is tilted in the cross sectional view of FIG. 9.
Figure 10B:
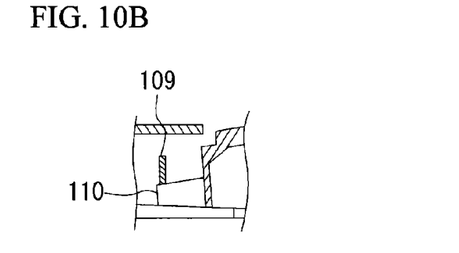
FIG. 10B is a cross sectional view concerning the first engaging unit and the third engaging unit.

FIGS. 8A to 10B are cross sectional views taken along a line VIII-VIII in FIG. 7, and illustrate a process in which the keyboard unit 11 is detached from the drawer unit 10. FIGS. 8A, 9A and 10A illustrate the states of the abutting parts 108, the elastic parts 111, the second engaging parts 115 and the fourth engaging parts 107. On the contrary, FIGS. 8B, 9B and 10B illustrate the states of the first engaging parts 110 and the third engaging parts 109.

FIG. 8A illustrates a state where the keyboard unit 11 is held in the holding part 106. In this state, the elastic parts 111 abut on the abutting parts 108 and bias the keyboard unit 11 in the depth direction. The second engaging parts 115 are engaged with the fourth engaging parts 107 by the bias of the elastic parts 111. That is, the keyboard unit 11 is pushed by a bias force of the elastic parts 111, so that the second engaging parts 115 are engaged with the fourth engaging parts 107. The first engaging parts 110 are engaged with the third engaging parts 109.

FIG. 9A illustrates a state where the keyboard unit 11 is slid in the direction of the compression of the elastic parts 111 (see a code "D1" of FIG. 8A). In this case, the elastic parts 111 abut on the abutting parts 108 in a state where the elastic parts 111 are compressed, and the first engaging parts 110 maintain an engaged state with the third engaging parts 109. Since an engaged state of the second engaging parts 115 and the fourth engaging parts 107 is released by the displacement of the keyboard unit 11, the end face 11b which is the rear face of the keyboard unit 11 becomes free.

The keyboard unit 11 has a taper part 11c that is formed on a bottom face of the keyboard unit 11, and extends from the end face 11a which is a front side of the keyboard unit 11 (see an enlarged part P4 of FIG. 9). The first engaging parts 110 also have the taper parts 110a. Therefore, the end face 11b which is a rear side of the keyboard unit 11 becomes free, so that the keyboard unit 11 can tilt by an angle θ to the bottom face 101a. The taper part 11c is formed such that a distance between the taper part 11c and the bottom face 101a increases toward the end face 11a.

FIG. 10A illustrates a state where the keyboard unit 11 is pivotally moved (see a code "D2" of FIG. 9A) and is tilted by the angle θ of the taper part 11c. In this case, the elastic parts 111 abut on the abutting parts 108 in a restoration state, and the first engaging parts 110 maintain an engaged state with the third engaging parts 109.

Since the keyboard unit 11 tilts by the angle θ, the end face 11b is located in the outside of the holding part 106. Therefore, the keyboard unit 11 moves in the depth direction (see a code "D3" of FIG. 10A), so that the elastic parts 111 are away from the abutting parts 108, and the engaged state of the first engaging parts 110 and the third engaging parts 109 is released. Thereby, the keyboard unit 11 is detached from the drawer unit 10. Here, attachment of the keyboard unit 11 to the drawer unit 10 is performed by performing a procedure that is reverse to the procedure described until now.

As described above, since the first engaging parts 110 provided on any one of the pair of opposed end faces 11a and 11b and the second engaging parts 115 provided on another one of the end faces engage with the third engaging parts 109 and the fourth engaging parts 107 that are provided on the drawer unit 10, respectively, the keyboard unit 11 is held in the drawer unit 10.

The elastic parts 111 abut on the abutting parts 108 provided on the drawer unit 10 and bias the keyboard unit 11 in a direction toward the end face 11b from the end face 11a. The second engaging parts 115 are engaged with the fourth engaging parts 107 by the bias of the elastic parts 111. Therefore, the keyboard unit 11 is moved in the direction of the compression of the elastic parts 111, so that the engagement between the second engaging parts 115 and the fourth engaging parts 107 is released, and the end face 11b becomes free. As a result, the keyboard unit 11 can be easily detached from the drawer unit 10. On the contrary, the keyboard unit 11 can be easily attached to the drawer unit 10 in the same manner as the detachment. Thus, the keyboard unit 11 can be attached to or detached from the drawer unit 10 without using a tool.

In the present embodiment, there is no limitation in the shape of the first engaging parts 110, the second engaging parts 115, the third engaging parts 109 and the fourth engaging parts 107. For example, each of the first engaging parts 110 and the second engaging parts 115 of the keyboard unit 11 may have a concave shape, and each of the third engaging parts 109 and the fourth engaging parts 107 may have a protrusion shape.

Although in the embodiments described above, the console drawer is described as receiving an information input device, the invention is not limited to this. The invention can also be applied to another portable computer device, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A keyboard device comprising:
   an elastic portion on a first end face of the keyboard device, abuts on an abutting portion provided on a keyboard holding device, and biases the keyboard device in a direction toward a second, opposed end face of the keyboard device;
   a first non-elastic engaging portion on the first end face and spaced from the elastic portion to engage a third engaging portion on the keyboard holding device; and
   a second engaging portion on the second end face to engage a fourth engaging portion provided on the keyboard holding device by the bias of the elastic portion,
   wherein the first non-elastic engaging portion is one of a projection and a recess, and the third engaging portion is the other of the projection and the recess.

2. The keyboard device according to claim 1, further comprising
   a concave portion for attaching and detaching the keyboard device that is formed on a top face of the keyboard device.

3. The keyboard device according to claim 1, further comprising
   a taper portion that is formed at a bottom face of the keyboard device, and extends from the first end face.

4. The keyboard device according to claim 1, wherein
   the elastic portion is a plate spring integrally molded with a housing of the keyboard device.

5. The keyboard device according to claim 4, further comprising
   a pair of protrusion portions that are provided at both sides of the elastic portion so as to interrupt compression of the elastic portion by abutting on the abutting portion.

6. The keyboard device according to claim 1,
   wherein the first engaging portion and the elastic portion are separately arranged in a lateral direction on the first end face.

7. A keyboard holding device comprising:
   a holding portion that holds a keyboard device;
   an abutting portion in the holding portion to abut an elastic portion provided on a first end face of the keyboard device;
   a third engaging portion in the holding portion to engage a first non-elastic engaging portion on the first end face of the keyboard device; and
   a fourth engaging portion in the holding portion, to engage a second engaging portion on a second, opposed end face of the keyboard device,
   wherein the first non-elastic engaging portion and the elastic portion are spaced from each other, and
   wherein the first non-elastic engaging portion is one of a projection and a recess, and the third engaging portion is the other of the projection and the recess.

8. An information input device having a keyboard device and a keyboard holding device, comprising:
   the keyboard device including:
   an elastic portion on a first end face of the keyboard device, abuts on an abutting portion provided on the keyboard holding device, and biases the keyboard device in a direction toward a second, opposed end face of the keyboard device;
   a first non-elastic engaging portion on the first end face and spaced from the elastic portion, to engage a third engaging portion on the keyboard holding device; and
   a second engaging portion on the second, opposed end face to engage a fourth engaging portion provided on the keyboard holding device by the bias of the elastic portion,
   wherein the first non-elastic engaging portion is one of a projection and a recess, and the third engaging portion is the other of the projection and the recess; and
   the keyboard holding device including:
   a holding portion that holds the keyboard device;
   the abutting portion that is provided in the holding portion, and abuts on the elastic portion;
   the third engaging portion that is provided in the holding portion, and engages with the first engaging portion; and
   the fourth engaging portion that is provided in the holding portion, and engages with the second engaging portion.

* * * * *